United States Patent
Song et al.

(10) Patent No.: US 6,329,253 B1
(45) Date of Patent: Dec. 11, 2001

(54) THICK OXIDE MOS DEVICE USED IN ESD PROTECTION CIRCUIT

(75) Inventors: Jun Song; Yonqzang Zhang, both of Singapore (SG); Shyue Fong Quek, Petaling Jaya (MY); Ting Cheong Ang; Jun Cai, both of Singapore (SG); Puay Ing Ong, Kluang Johor (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/434,922

(22) Filed: Nov. 5, 1999

(51) Int. Cl.$^7$ ................... H01L 21/336; H01L 21/425; H01L 21/3205; H01L 21/4763
(52) U.S. Cl. .................. 438/281; 438/259; 438/529; 438/589
(58) Field of Search .................. 438/281, 259, 438/430, 227, 529, 589

(56) References Cited

U.S. PATENT DOCUMENTS

| | | | |
|---|---|---|---|
| 5,399,515 | * 3/1995 | Davis et al. . | |
| 5,567,634 | * 10/1996 | He'bert et al. . | |
| 5,629,544 | 5/1997 | Voldman et al. | 257/355 |
| 5,723,376 | * 3/1998 | Takeuchi et al. . | |
| 5,744,841 | 4/1998 | Gilbert et al. | 257/360 |
| 5,885,875 | 3/1999 | Hsu | 438/289 |
| 5,918,117 | 6/1999 | Yun | 438/200 |
| 5,963,799 | * 10/1999 | Wu . | |
| 6,051,488 | * 4/2000 | Lee et al. . | |
| 6,066,532 | * 5/2000 | Chen et al. . | |
| 6,197,661 | * 3/2001 | Mogami et al. . | |

* cited by examiner

Primary Examiner—Charles Bowers
Assistant Examiner—Ron Pompey

(57) ABSTRACT

A method for forming a novel thick oxide electrostatic discharge device using shallow trench isolation technology is described. A trench is etched into a semiconductor substrate. An oxide layer is deposited overlying the semiconductor substrate and filling the trench. The oxide within the trench is partially etched away leaving the oxide on the sidewalls and bottom of the trench. The oxide is polished away to the surface of the semiconductor substrate whereby oxide remains only on the sidewalls and bottom of the trench. A gate is formed within the trench whereby the gate is surrounded by the oxide. First ions are implanted into the semiconductor substrate adjacent to the trench to form N-wells. Second ions are implanted into the semiconductor substrate in a top portion of the N-wells to form source/drain regions. Third ions are implanted into the semiconductor substrate underlying the N-wells and underlying the trench to form electrostatic discharge trigger taps. This completes formation of an electrostatic discharge device in the fabrication of integrated circuits.

26 Claims, 7 Drawing Sheets

THICK OXIDE MOS DEVICE USED IN ESD PROTECTION CIRCUIT

BACKGROUND OF THE INVENTION (1) Field of the Invention

The present invention relates to the fabrication of integrated circuit devices, and more particularly, to a method of forming an electrostatic discharge device using shallow trench isolation technology in the fabrication of integrated circuits.

(2) Description of the Prior Art

Electrostatic discharge (ESD) refers to a high voltage accidentally applied to an integrated circuit. ESD can result from either automated or human handling. If the voltage applied to the gate insulator becomes excessive, the gate oxide can break down. MOSFET devices are particularly vulnerable to ESD damage. Because of this danger, ESD protection transistors are fabricated to direct ESD current away from the circuit it is protecting.

Figure 1:
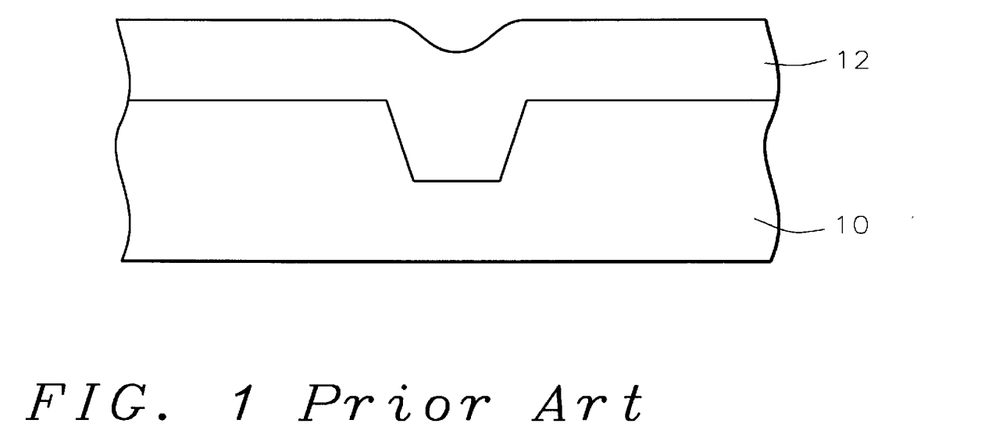
FIGS. 1 through 3 are cross-sectional representations of a shallow trench isolation process of the prior art.
Figure 2:
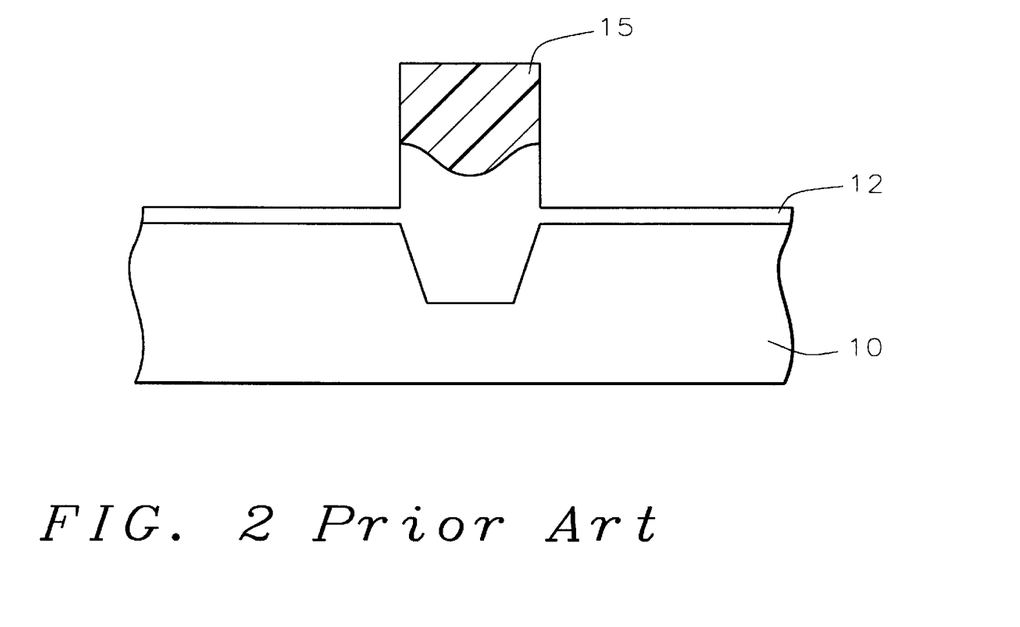
Figure 3:
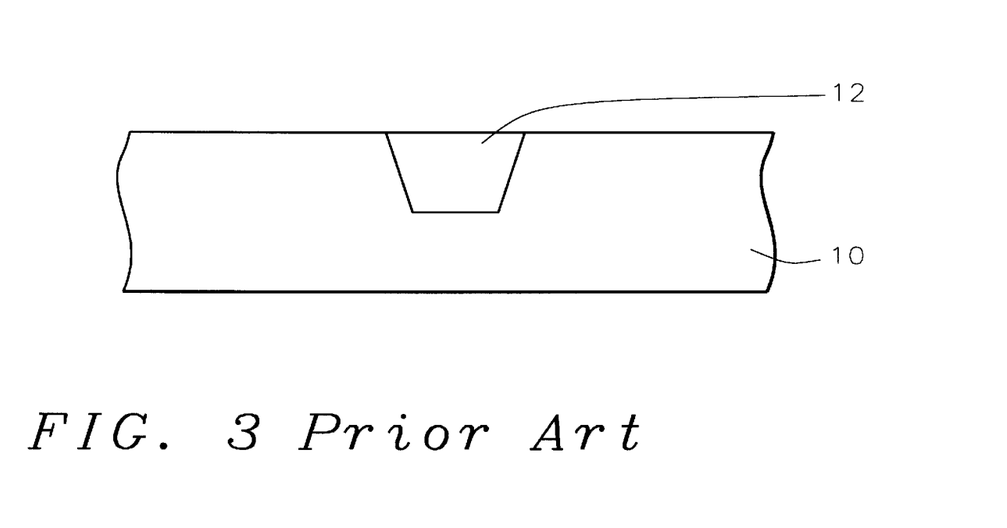

Shallow trench isolation (STI) is widely used in integrated circuit manufacturing. One conventional STI process is illustrated in FIGS. 1–3. Referring to FIG. 1, there is shown a trench etched into the semiconductor substrate 10. The trench is filled with a dielectric layer 12 by any of a variety of gap-filling methods. In order to avoid dishing of the STI region during polishing, such as by chemical mechanical polishing (CMP), a reverse trench mask 15 is formed over the trench. Most of the dielectric layer 12 is etched away where it is not covered by the mask 15. The mask is removed and the dielectric layer is planarized to the surface of the substrate, as shown in FIG. 3.

The present invention uses a method similar to this STI technology to form an ESD device.

A number of patents present a variety of methods to form ESD devices. U.S. Pat. No. 5,629,544 to Voldman et al teaches forming an ESD gate partially over an STI region. U.S. Pat. No. 5,744,841 to Gilbert et al shows a halo region around the source and/or drain to optimize breakdown voltage and shows an ESD gate over a field oxide regions. U.S. Pat. No. 5,918,117 to Yun shows a method of forming an ESD device. U.S. Pat. No. 5,885,875 to Hsu discloses an ESD device over a field oxide region and an ESD implant under the field oxide region.

SUMMARY OF THE INVENTION

Accordingly, the primary object of the invention is to provide a process for forming an electrostatic discharge device in the fabrication of integrated circuits.

A further object of the invention is to provide a process for forming an electrostatic discharge device using shallow trench isolation technology.

Another object of the invention is to provide a process for forming a novel thick oxide electrostatic discharge device using shallow trench isolation technology.

In accordance with the objects of the invention, a method for forming a novel thick oxide electrostatic discharge device using shallow trench isolation technology is achieved. A trench is etched into a semiconductor substrate. An oxide layer is deposited overlying the semiconductor substrate and filling the trench. The oxide within the trench is partially etched away leaving the oxide on the sidewalls and bottom of the trench. The oxide is polished away to the surface of the semiconductor substrate whereby oxide remains only on the sidewalls and bottom of the trench. A gate is formed within the trench whereby the gate is surrounded by the oxide. First ions are implanted into the semiconductor substrate adjacent to the trench to form N-wells. Second ions are implanted into the semiconductor substrate in a top portion of the N-wells to form source/drain regions. Third ions are implanted into the semiconductor substrate underlying the trench. Optionally, ions are implanted underlying the N-wells to form electrostatic discharge trigger taps. This completes formation of an electrostatic discharge device in the fabrication of integrated circuits.

BRIEF DESCRIPTION OF THE DRAWINGS

In the accompanying drawings forming a material part of this description, there is shown:

FIGS. 4 through 13 are cross-sectional representations of a preferred embodiment of the present invention.

DESCRIPTION OF THE PREFERRED EMBODIMENTS

FIGS. 4–13 illustrate a process for making a thick oxide ESD device using shallow trench isolation technology. It should be understood by those skilled in the art that the process of the invention can be used in any application in which it is desired to have a thick oxide surrounding a gate. This is particularly important in the case of an ESD device, but is not limited to that application.

Figure 4:
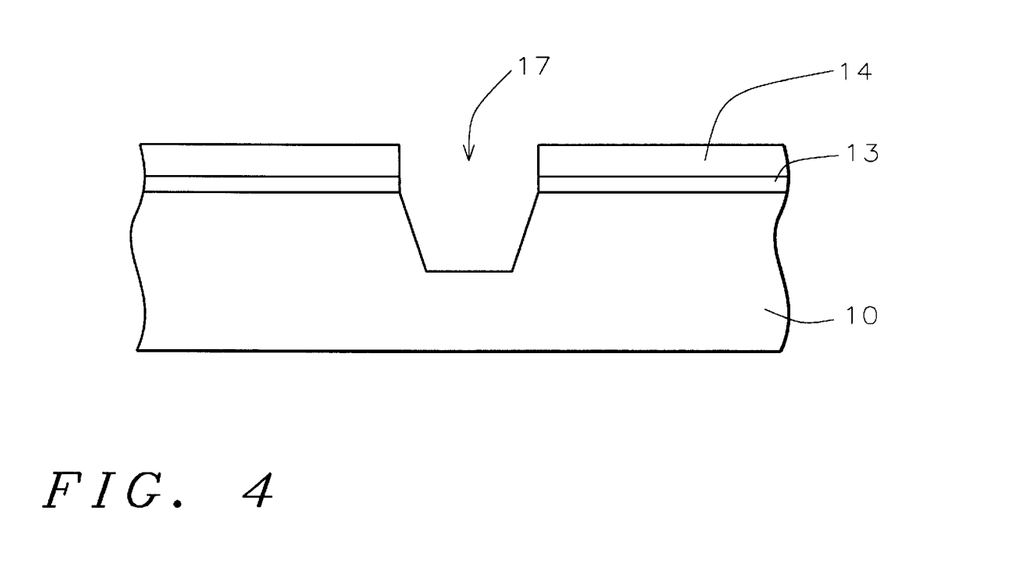

Referring now more particularly to FIG. 4, there is shown a semiconductor substrate 10. A layer of pad silicon oxide 13 is grown on the surface of the semiconductor substrate to a thickness of between about 50 and 400 Angstroms, and preferably about 200 Angstroms. A layer of silicon nitride 14 is deposited over the pad oxide layer 13 to a thickness of between about 500 and 3000 Angstroms, and preferably about 1700 Angstroms.

A photoresist mask, not shown, is formed over the surface of the nitride layer with an opening where the shallow trench isolation region is to be formed. Using conventional photolithography and etching techniques, the nitride layer is etched to leave an opening where the isolation region is to be formed. Using the silicon nitride as a hard mask, the pad oxide layer and the semiconductor substrate exposed within the opening are etched into to a depth of between about 2000 and 6000 Angstroms, and preferably about 3500 Angstroms, to form a trench 17.

Figure 5:
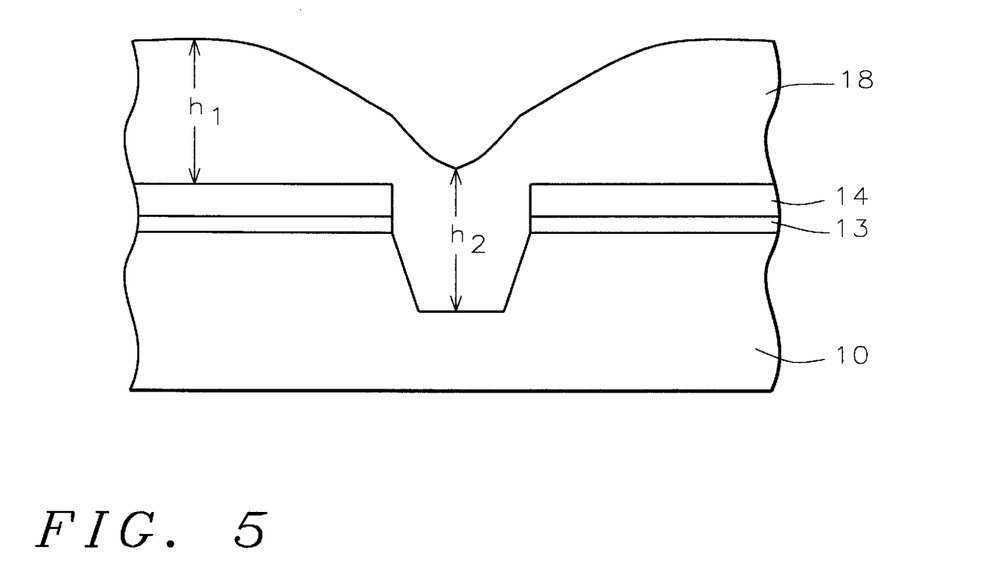

Referring now to FIG. 5, an oxide layer 18 is deposited over the nitride layer 14 and filling the trench 17. The oxide layer may comprise tetraethoxysilane (TEOS) oxide or high density plasma (HDP) oxide deposited by chemical vapor deposition to a thickness of between about 6000 and 8000 Angstroms, and preferably about 7000 Angstroms. The thickness of the oxide layer 18 over the nitride layer h1 should be approximately equal to the thickness of the oxide within the trench h2.

In the shallow trench isolation process described above with reference to FIGS. 1–3, a reverse trench mask was formed over the substrate to cover the trench region. In the process of the present invention, a modified reverse mask process is used. That is, a mask, not shown, is formed to cover the substrate with an opening over the ESD transistor area. The entire portion of the wafer in the figures comprises the ESD transistor area, so the photoresist mask is not formed in this area.

Figure 6:
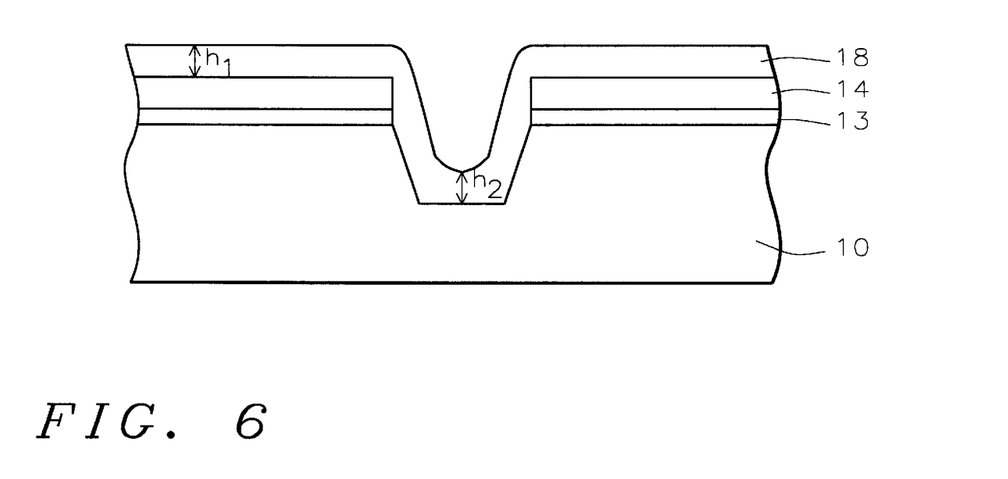

Referring now to FIG. 6, the oxide layer 18 is partially etched away where it is not covered by the mask in the ESD area. This will leave the oxide layer 18 on the sidewalls and bottom of the trench. Now, the thickness of the oxide layer 18 over the nitride layer h1 and the thickness of the oxide layer within the trench h2 are both about 1000 Angstroms.

Figure 7A:
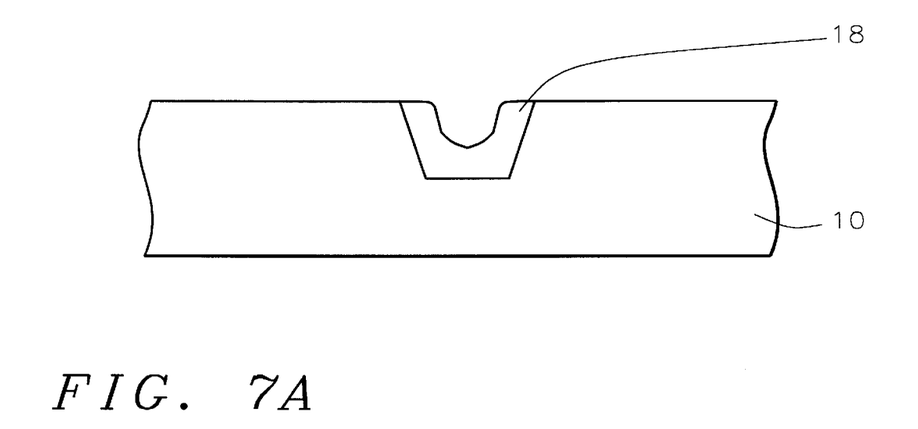
FIGS. 7A and 7B are cross-sectional representations of a two alternatives in a preferred embodiment of the present invention.
Figure 7B:
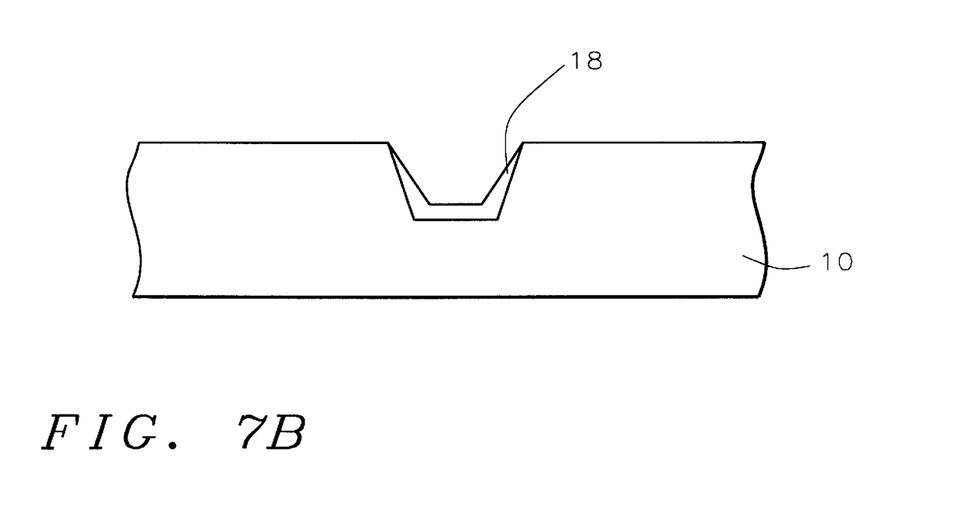

The mask is removed and the nitride and pad oxide as well as the oxide layer overlying the nitride are polished away, for example, by chemical mechanical polishing (CMP) resulting in FIG. 7A or 7B. FIG. 7A illustrates the case where a TEOS oxide was used as layer 18. FIG. 7B illustrates the case where an HDP oxide layer 18 was used. The remaining figures follow FIG. 7A, but it is to be understood that the process following FIG. 7B will be the same.

The oxide layer 18 is left only within the trench on the sidewalls and bottom of the trench. The oxide on the bottom of the trench has a thickness of between about 500 and 2000 Angstroms and the oxide on the sidewalls of the trench has a width of between about 0 and 0.5 microns, depending upon the trench filling material, as shown in FIGS. 7A and 7B.

Figure 8:
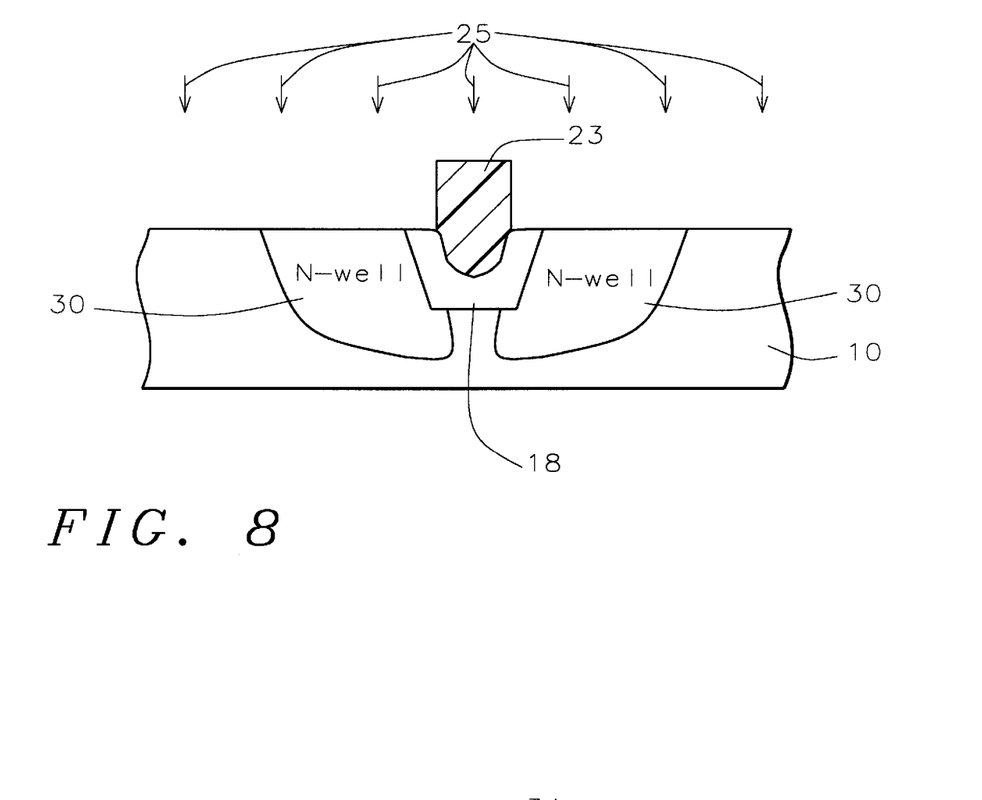

Now the electrostatic discharge (ESD) device will be fabricated within the trench. Referring now to FIG. 8, a conventional N-well mask 23 covers the central portion of the trench. An ion implant 25 forms N-wells 30 within the substrate adjacent to the trench oxide 18. This may be an angled implant. The N-wells 30 have a junction depth of about 1.3 microns. Phosphorus ions are implanted 25 at a dosage of between about $10^{13}$ and $10^{14}$ atoms/cm$^2$ at an energy of 400 to 600 KeV to form the N-wells 30. Depending upon the device specifications, P-wells could be formed instead using a boron ion implant at a dosage of about $10^{13}$ atoms/cm$^2$ at an energy of about 220 KeV.

Figure 9:
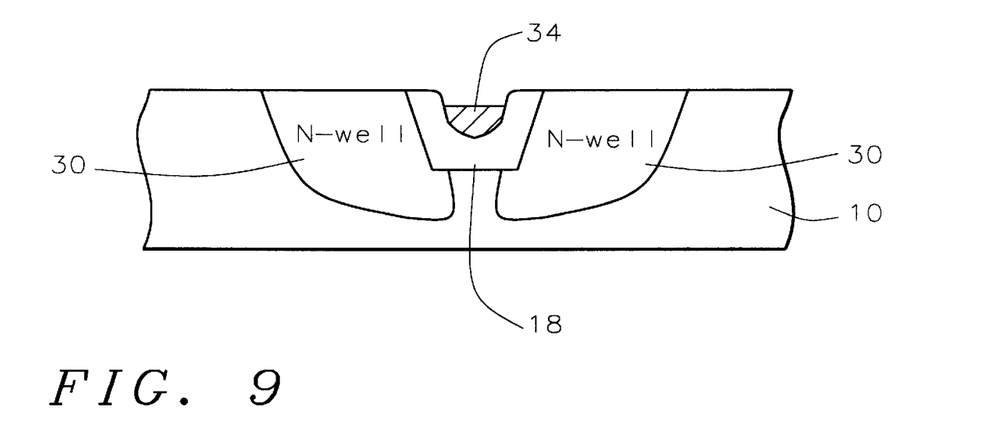

Now, a gate material is deposited over the substrate and within the oxide trench 18. This may be polysilicon deposited by low pressure chemical vapor deposition (LPCVD) at 600 to 700° C. to a thickness of between about 2000 and 2500 Angstroms. Alternatively, the gate material may be a stack comprising tungsten/silicon/germanium, or the like. The gate material is now patterned to form the gate 34 as shown in FIG. 9. The gate is contained completely within the oxide trench so that the gate has better control to turn on the ESD device.

Figure 10:
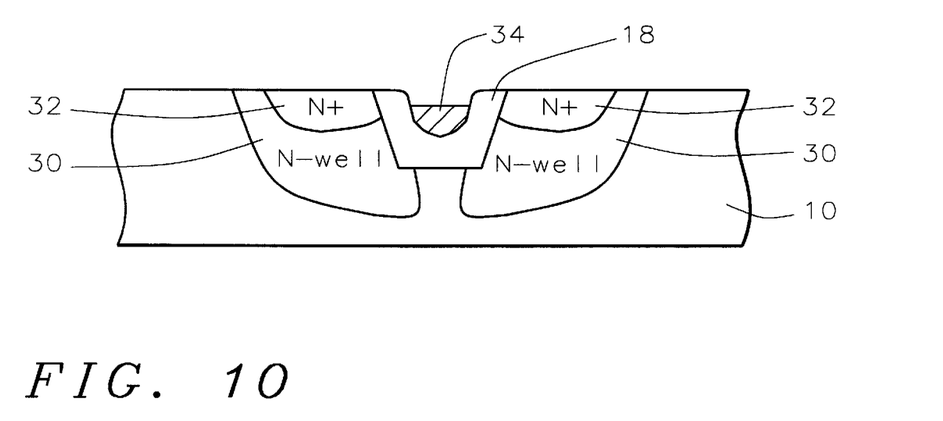

Referring to FIG. 10, arsenic ions are implanted at a dosage of between about $10^{15}$ and $5\times10^{15}$ atoms/cm$^2$ at an energy of 50 to 100 KeV to form source and drain regions 32 in top portions of the N-wells 30, using a self-aligning implant.

Figure 11:
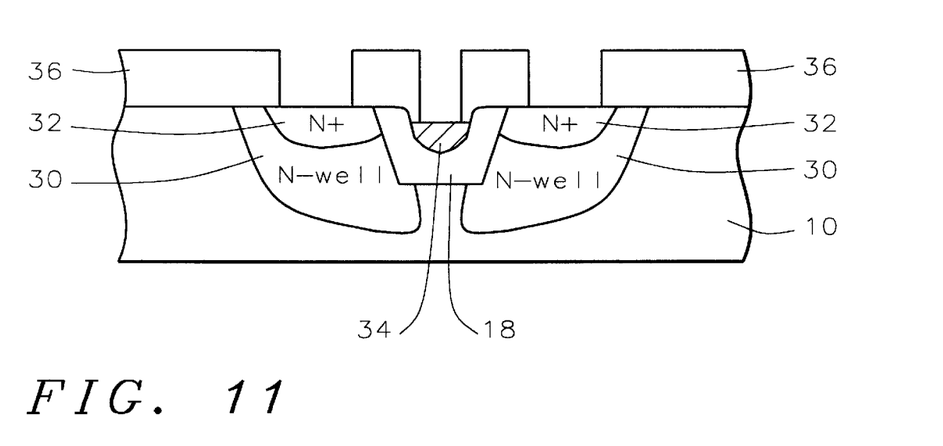

Referring now to FIG. 11, a dielectric layer 36, such as oxide, undoped silicate glass (USG), or borophosphosilicate glass (BPSG), for example, is deposited over the substrate to a thickness of between about 9000 and 14,000 Angstroms. Openings are etched through the dielectric layer 36 to the gate 34 and to the source/drain regions 32.

Figure 12:
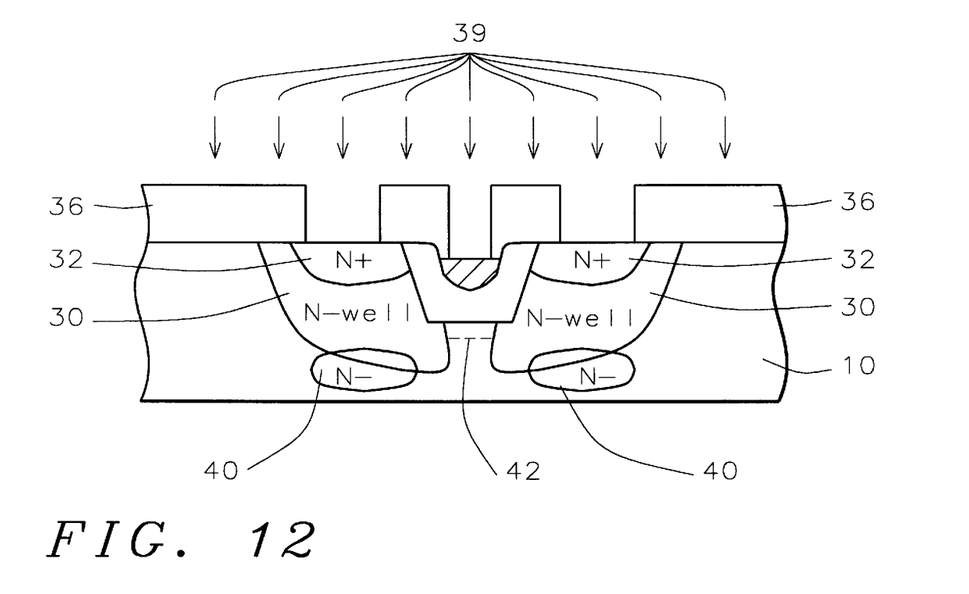

FIG. 12 illustrates an ESD implant 39 made through the contact openings. The implanted region 42 under the oxide trench 18 forms a P-well in the channel area. Optional N-regions 40 are implanted under the N-wells using a phosphorus implant at about $10^{15}$ atoms/cm$^2$ at 400 to 500 KeV. These optional implants provide a low tripper tap for the ESD device to improve performance.

Figure 13:
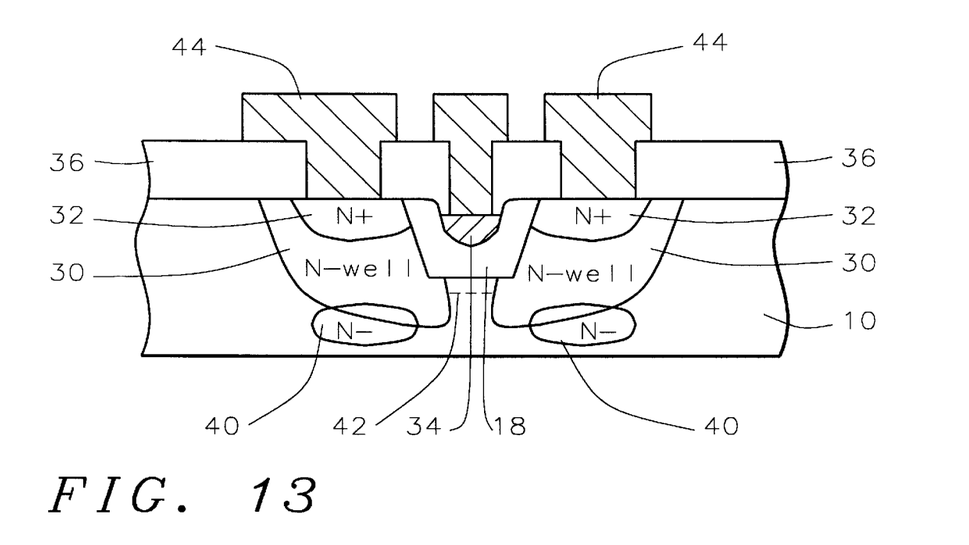

FIG. 13 illustrates the formation of interconnection lines 44. A conducting layer is deposited over the substrate and within the contact openings and patterned to form connection lines 44.

This completes formation of the electrostatic discharge device. The process of the present invention results in the formation a thick oxide electrostatic discharge device. The use of shallow trench isolation technology provides the thick oxide surrounding the gate. Since the gate is completely within the oxide-lined trench, the gate has better control to turn on the ESD device. The optional low trigger tap implants under the N-wells further improve the performance of the ESD device in terms of lower snapback voltage and hence, lower trigger voltage.

While the invention has been particularly shown and described with reference to the preferred embodiments thereof, it will be understood by those skilled in the art that various changes in form and details may be made without departing from the spirit and scope of the invention.

What is claimed is:

1. A method of forming an electrostatic discharge device in the fabrication of integrated circuits comprising:

etching a trench into a semiconductor substrate;

depositing an oxide layer overlying said semiconductor substrate and filling said trench;

partially etching away said oxide within said trench leaving said oxide on the sidewalls and bottom of said trench;

polishing away said oxide to the surface of said semiconductor substrate whereby said oxide remains only on the sidewalls and bottom of said trench;

implanting first ions into said semiconductor substrate adjacent to said trench to form N-wells;

forming a gate within said trench whereby said gate is surrounded by said oxide; and implanting second ions into said semiconductor substrate in a top portion of said N-wells to form source/drain regions to complete formation of said electrostatic discharge device in the fabrication of integrated circuits.

2. The method according to claim 1 wherein said trench has a depth of between about 3000 and 3500 Angstroms.

3. The method according to claim 1 wherein said oxide layer remaining on said sidewalls and bottom of said trench has a thickness of between about 500 and 2000 Angstroms.

4. The method according to claim 1 wherein said gate comprises polysilicon having a thickness of between about 2000 and 2500 Angstroms.

5. The method according to claim 1 wherein said gate comprises tungsten/polysilicon/germanium having a thickness of between about 2500 and 3000 Angstroms.

6. The method according to claim 1 wherein said step of implanting first ions comprises implanting phosphorus ions at a dosage of between about $10^{13}$ and $10^{14}$ atoms/cm$^2$ at an energy of 400 to 600 KeV.

7. The method according to claim 1 wherein said step of implanting second ions comprises implanting arsenic ions at a dosage of between about $10^{15}$ and $5\times10^{15}$ atoms/cm$^2$ at an energy of 50 to 100 KeV.

8. The method according to claim 1 further comprising implanting phosphorus ions at a dosage of between about $10^{14}$ and $10^{15}$ atoms/cm$^2$ at an energy of 400 to 500 KeV to form electrostatic discharge trigger taps underlying said N-wells.

9. The method according to claim 1 further comprising:

depositing a dielectric layer overlying said substrate;

providing openings through said dielectric layer to underlying said source/drain regions and to said gate;

depositing a conducting layer overlying said dielectric layer and filling said openings; and patterning said conducting layer to form leads in the fabrication of said integrated circuit.

10. A method of forming an electrostatic discharge device in the fabrication of integrated circuits comprising:

depositing a pad oxide layer on the surface of a semiconductor substrate;

depositing a nitride layer overlying said pad oxide layer;

patterning said nitride layer to provide an opening to said pad oxide layer;

etching a trench through said pad oxide layer within said opening and into said semiconductor substrate;

depositing an oxide layer overlying said nitride layer and filling said trench;

partially etching away said oxide within said trench leaving said oxide on the sidewalls and bottom of said trench;

polishing away said oxide, said nitride layer and said pad oxide layer to the surface of said semiconductor substrate whereby said oxide remains only on the sidewalls and bottom of said trench;

implanting first ions into said semiconductor substrate adjacent to said trench to form N-wells;

forming a gate within said trench whereby said gate is surrounded by said oxide;

implanting second ions into said semiconductor substrate in a top portion of said N-wells to form source/drain regions; and implanting third ions into said semiconductor substrate underlying said N-wells to form electrostatic discharge trigger taps to complete formation of said electrostatic discharge device in the fabrication of integrated circuits.

11. The method according to claim 10 wherein said trench has a depth of between about 3000 and 3500 Angstroms.

12. The method according to claim 10 wherein said oxide layer remaining on said sidewalls and bottom of said trench has a thickness of between about 500 and 2000 Angstroms.

13. The method according to claim 10 wherein said gate comprises polysilicon having a thickness of between about 2000 and 2500 Angstroms.

14. The method according to claim 10 wherein said gate comprises tungsten/polysilicon/germanium having a thickness of between about 2000 and 3000 Angstroms.

15. The method according to claim 10 wherein said step of implanting first ions comprises implanting phosphorus ions at a dosage of between about $10^{13}$ and $10^{14}$ atoms/cm$^2$ at an energy of 400 to 600 KeV.

16. The method according to claim 10 wherein said step of implanting second ions comprises implanting arsenic ions at a dosage of between about $10^{15}$ and $5 \times 10^{15}$ atoms/cm$^2$ at an energy of 50 to 100 KeV.

17. The method according to claim 10 wherein said step of implanting third ions comprises implanting phosphorus ions at a dosage of between about $10^{14}$ and $10^{15}$ atoms/cm$^2$ at an energy of 400 to 600 KeV.

18. The method according to claim 10 further comprising:

depositing a dielectric layer overlying said substrate;

providing openings through said dielectric layer to underlying said source/drain regions and to said gate;

depositing a conducting layer overlying said dielectric layer and filling said openings; and patterning said conducting layer to form leads in the fabrication of said integrated circuit.

19. A method of forming an electrostatic discharge device in the fabrication of integrated circuits comprising:

depositing a pad oxide layer on the surface of a semiconductor substrate;

depositing a nitride layer overlying said pad oxide layer;

patterning said nitride layer to provide an opening to said pad oxide layer;

etching a trench through said pad oxide layer within said opening and into said semiconductor substrate;

depositing an oxide layer overlying said nitride layer and filling said trench;

partially etching away said oxide within said trench leaving said oxide on the sidewalls and bottom of said trench;

polishing away said oxide, said nitride layer and said pad oxide layer to the surface of said semiconductor substrate whereby said oxide remains only on the sidewalls and bottom of said trench;

implanting first ions into said semiconductor substrate adjacent to said trench to form N-wells;

forming a gate within said trench whereby said gate is surrounded by said oxide;

implanting second ions into said semiconductor substrate in a top portion of said N-wells to form source/drain regions;

implanting third ions into said semiconductor substrate underlying said N-wells and underlying said trench to form electrostatic discharge trigger taps;

depositing a dielectric layer overlying said substrate;

providing openings through said dielectric layer to underlying said source/drain regions and to said gate;

depositing a conducting layer overlying said dielectric layer and filling said openings; and patterning said conducting layer to form leads completing formation of said electrostatic discharge device in the fabrication of integrated circuits.

20. The method according to claim 19 wherein said trench has a depth of between about 3000 and 3500 Angstroms.

21. The method according to claim 19 wherein said oxide layer remaining on said sidewalls and bottom of said trench has a thickness of between about 500 and 2000 Angstroms.

22. The method according to claim 19 wherein said gate comprises polysilicon having a thickness of between about 2000 and 2500 Angstroms.

23. The method according to claim 19 wherein said gate comprises tungsten/polysilicon/germanium having a thickness of between about 2500 and 3000 Angstroms.

24. The method according to claim 19 wherein said step of implanting first ions comprises implanting phosphorus ions at a dosage of between about $10^{13}$ and $10^{14}$ atoms/cm$^2$ at an energy of 400 to 600 KeV.

25. The method according to claim 19 wherein said step of planting second ions comprises implanting arsenic ions at a dosage of between about $10^5$ and $5 \times 10^{15}$ atoms/cm$^2$ at an energy of 50 to 100 KeV.

26. The method according to claim 19 wherein said step of implanting third ions comprises implanting phoshorus ions at a dosage of between about $10^{14}$ and $10^{15}$ atoms/cm$^2$ at an energy of 400 to 600 KeV.

* * * * *

UNITED STATES PATENT AND TRADEMARK OFFICE
CERTIFICATE OF CORRECTION

| | | |
|---|---|---|
| PATENT NO. | : 6,329,253 B1 | Page 1 of 1 |
| DATED | : December 11, 2001 | |
| INVENTOR(S) | : Jun Song, Yonqzang Zhang, Shyue Fong Quek, Ting Cheong Ang, Jun Cai and Puay Ing Ong | |

It is certified that error appears in the above-identified patent and that said Letters Patent is hereby corrected as shown below:

Title page,
Please add Item [74], *Attorney, Agent or Firm* - George O. Saile; Rosemary L.S. Pike.

Signed and Sealed this

Sixteenth Day of April, 2002

*Attest:*

JAMES E. ROGAN
*Attesting Officer*     *Director of the United States Patent and Trademark Office*